United States Patent [19]

Pascucci

[11] Patent Number: 5,734,610

[45] Date of Patent: Mar. 31, 1998

[54] CIRCUIT FOR READING NON-VOLATILE MEMORIES

[75] Inventor: Luigi Pascucci, Sesto San Giovanni, Italy

[73] Assignee: SGS-Thomson Microelectronics S.r.l., Agrate Brianza, Italy

[21] Appl. No.: 690,530

[22] Filed: Jul. 31, 1996

[30] Foreign Application Priority Data

Aug. 4, 1995 [IT] Italy ................................ 95830357.0

[51] Int. Cl.⁶ .................................................. G11C 16/06
[52] U.S. Cl. ........................... 365/185.23; 365/185.24; 365/189.01; 365/191
[58] Field of Search ...................... 365/185.23, 185.01, 365/189.01, 185.24, 191

[56] References Cited

U.S. PATENT DOCUMENTS

| 5,175,705 | 12/1992 | Iwahashi | 365/204 |
| 5,303,189 | 4/1994 | Devin et al. | |
| 5,608,687 | 3/1997 | Komarek et al. | 365/233.5 |

FOREIGN PATENT DOCUMENTS

| 0 447 277 | 6/1991 | European Pat. Off. | G11C 16/06 |
| 0 516 225 | 12/1992 | European Pat. Off. | G11C 10/06 |
| 2-285593 | 11/1990 | Japan . | |

OTHER PUBLICATIONS

European Search Report relating to EP 95 83 0357, filed on Aug. 4, 1995.
Patent Abstract of Japan, vol. 17, No. 585 (P-1632), Oct. 25, 1993 & JP-1A-05 166389, Jul. 2, 1993.

*Primary Examiner*—Viet Q. Nguyen
*Attorney, Agent, or Firm*—Wolf, Greenfield & Sacks, P.C.; James H. Morris

[57] ABSTRACT

A reading circuit includes, for each bit line of a matrix of memory cells, a controllable switching element which can connect the bit line to a voltage source in response to a control signal applied to a control terminal thereof, a detector stage sensitive to the flow of current through the bit line, and a driving stage including two field-effect transistors connected in the inverter configuration with the input of the inverter connected to the bit line and with the output of the inverter connected to the control terminal of the controllable switching element. In order to charge the capacitance associated with the bit line rapidly but without causing oscillatory phenomena, the driving stage includes circuitry for reducing the gain of the feedback loop formed by the inverter and by the controllable switching element.

14 Claims, 3 Drawing Sheets

CIRCUIT FOR READING NON-VOLATILE MEMORIES

BACKGROUND OF THE INVENTION

1. Field of the Invention

The present invention relates to a circuit for reading a non-volatile memory.

2. Discussion of the Related Art

It is known that, in order to read a cell of a matrix of cells of a non-volatile memory, that is, in order to know whether the cell is in one or another of the two binary logic states, it is necessary to apply suitable voltages between the electrodes of the cell by means of a pair of lines, known as the bit line and the word line, at the intersection of which the cell is situated and to check if a current is flowing in the bit line.

If the cell thus selected is in logic state "1", that is if it is programmed, no current will flow. On the other hand, if it is in logic state "0", that is if it is not programmed, a current will flow. Each bit line is associated with a reading circuit which can detect the presence or absence of a current in the line and can thus read the state of a selected cell. The reading is carried out as an absolute measurement or as a relative measurement according to the type of circuit.

FIG. 1 shows schematically a known reading circuit 10 associated with a bit line of a matrix 11 of non-volatile memory cells having a plurality of bit lines, shown vertically in the drawing, and a plurality of word lines, shown horizontally in the drawing. A cell is identified by the intersection of a bit line, indicated BL, with a word line, indicated WL. Column decoding circuits, indicated 8, enable one individual bit line to be activated at a time and line decoding circuits, indicated 9, enable one individual word line to be activated at a time. Suitable voltages are thus applied between the electrodes of the memory cell selected at the time in question, for example, the cell indicated 12 in the drawing, by an activated bit line and an activated word line to enable the cell to be read by the circuit 10. A reading circuit identical to the circuit 10 is intended to be associated with each of the other bit lines.

Since each bit line has a capacitance to ground ($C_{BL}$ in the drawing) (typically a few pF) which cannot be ignored, the task of the reading circuit is first of all to charge this capacitance rapidly to a predetermined reading voltage level (typically about 1V) and then to detect the presence of a current due to a cell which is conducting, that is, not programmed, or the absence of such a current, which indicates that the cell selected is not conducting, that is, that it is programmed.

The circuit 10 is constituted by three main functional blocks: a first block, indicated 14, is constituted essentially by a circuit branch with a controllable switching element which can connect the bit line BL to the positive pole $V_{DD}$ of a voltage supply (the negative pole of which, indicated by the ground symbol, is connected to an electrode of every cell of the memory); a second block, indicated 15, constitutes a driving stage for the switching element and has its output, indicated CAS, connected to the block 14, a first input connected to the bit line BL and a second, enabling input, indicated A, connected to a logic signal generator, not shown; a third comparator and amplifier block 16 has the function of detecting the current flowing through the bit line BL and has a first input connected to the output of the block 14 and a second input RIF connected to a reference voltage source, not shown. The output OUT of this block 16 is the output of the reading circuit and is applied to other circuits, not shown, for further amplification of the signal resulting from the reading and for the use thereof, together with other data derived from the memory.

The switching element of the block 14 is constituted by a N-channel field-effect transistor, indicated To with its source connected to the bit line BL and its drain connected to the pole $V_{DD}$ (typically about 4V) of the supply by means of a resistive load constituted by a P-channel transistor $T_L$ the gate terminal of which is connected to earth. The gate terminal of the transistor To is connected to the output of the driving stage 15. The latter is constituted essentially by an inverter formed by two complementary transistors, an N-channel transistor, indicated TNB, connected between the output terminal CAS of the circuit and earth, and a P-channel transistor, indicated TPB, connected between the output terminal CAS of the circuit and a P-channel transistor, indicated TPS, connected and the pole $V_{DD}$. The gate terminals of the two transistors of the inverter are jointed together at the input of the circuit connected to the bit line BL. Another N-channel transistor, indicated TNS, is also connected between the output CAS and earth. The gate terminals of the transistors TPS and TNS are joined together at the enabling input A.

The operation of the circuit will now be considered. In the rest or cut-off condition of the reading circuit, the bit line BL is at substantially zero voltage corresponding to logic level 0 and the enabling terminal A is at a predetermined positive voltage corresponding to logic level 1. In these conditions, the transistor TPS is biased so as to be cm off, the transistor TNS, is biased so as to conduct, the output CAS is at level 0 and the transistor To is biased so as to be cut off. No current flows in the circuit branch of the block 14.

As soon as the cell 12 to be read is selected, the enabling terminal A is brought to level 0 so that the transistor TPS becomes conductive and the transistor TNS is cut off. Since the transistor TPB is biased for conduction and the transistor TNB is biased so as to be cut off (because the bit line is still at zero), the voltage at the output CAS rises until the transistor To is made conductive as soon as its threshold voltage is exceeded. A current starts to flow through the branch 14 and rapidly charges the capacitance $C_{BL}$ associated with the bit line and supplies to the input of the comparator 16 a voltage signal, the level of which depends upon the state of the cell selected. More precisely, this level will be higher in the case of a programmed, that is, non-conducting cell, and lower in the case of a non-programmed, that is, conducting cell. This signal is compared with the reference signal RIF at the other input of the comparator so that there is a signal corresponding to the state of the cell at the output of the comparator.

As soon as the voltage of the bit line BL at the input of the driving stage 15 reaches the conduction 'threshold of the transistor TNB (about 0.8V), the latter starts to conduct. The effect of this is that the voltage of the bit line BL remains constant during reading.

The circuit described above is characterized by a very rapid response, owing to the fact that the inverter of the driving stage and the transistor To are interconnected so as to form a feedback loop. This constitutes an advantage when great rapidity of the memory-reading function as a whole is required but may give rise to oscillatory phenomena which often make this advantage useless. More particularly, since the working potential (about 1V) for non-volatile memories is normally set very close to the threshold value (about 0.8V) of an N-channel transistor such as the transistor TNB, the sudden transition of the transistor TNB from the cut off state to the conductive state may cause the voltage of the bit line BL to exceed the predetermined optimal working potential and, in some cases, may cause the transistor To to be cut off, even if only briefly. Exceeding the working potential constitutes a problem since the return to the correct potential is very slow because, if the memory cell is biased for conduction, that is, if it is not programmed, the capacitance CB, is discharged through the cell which can conduct a very low current. Cutting-off the transistor To is very risky since, in these conditions, reading the selected cell is completely uncertain, since the path between the bit line BL and the comparator 16 is broken.

SUMMARY OF THE INVENTION

An object of the present invention is to provide a circuit for reading a non-volatile memory which does not have the disadvantages of the known circuit described above, that is, in particular, which is not subject to oscillatory phenomena during the charging of the capacitances associated with the bit lines.

This and other objects are achieved by a circuit for reading a non-volatile memory formed by a matrix of cells having a plurality of bit lines and of word lines, comprising, for each bit line, a controllable switching element which can connect the bit line to a voltage source in response to a control signal applied to a control terminal thereof, a detector stage sensitive to the flow of current through the bit line, and a driving stage comprising two field-effect transistors connected as an inverter, with the input of the inverter connected to the bit line and with the output of the inverter connected to the control terminal of the controllable switching element, wherein the driving stage comprises circuitry for reducing the gain of the feedback loop formed by the inverter and by the controllable switching element.

According to another embodiment of the invention, the two field-effect transistors are of complimentary type with their gate terminals joined together at the input of the inverter and with their drain terminals joined together at the output of the inverter.

According to another embodiment, the circuitry for reducing the gain comprises an additional N-channel transistor having a conduction threshold lower than that of the N-channel transistor of the inverter and connected in parallel with the N-channel transistor of the inverter.

According to another embodiment of the invention, the circuitry for reducing the gain comprises an N-channel bypass transistor connected like a diode between the source and drain terminals of the P-channel transistor of the inverter.

According to another embodiment of the invention, the driving stage comprises an additional P-channel transistor with a negative threshold higher than the threshold of the P-channel transistor of the inverter, connected like a diode between the drain and source terminals of the N-channel transistor of the inverter.

BRIEF DESCRIPTION OF THE DRAWINGS

The invention will be understood better from the following detailed description of an embodiment thereof given by way of non-limiting example, with reference to the appended drawings, in which.

DETAILED DESCRIPTION

Figure 1:
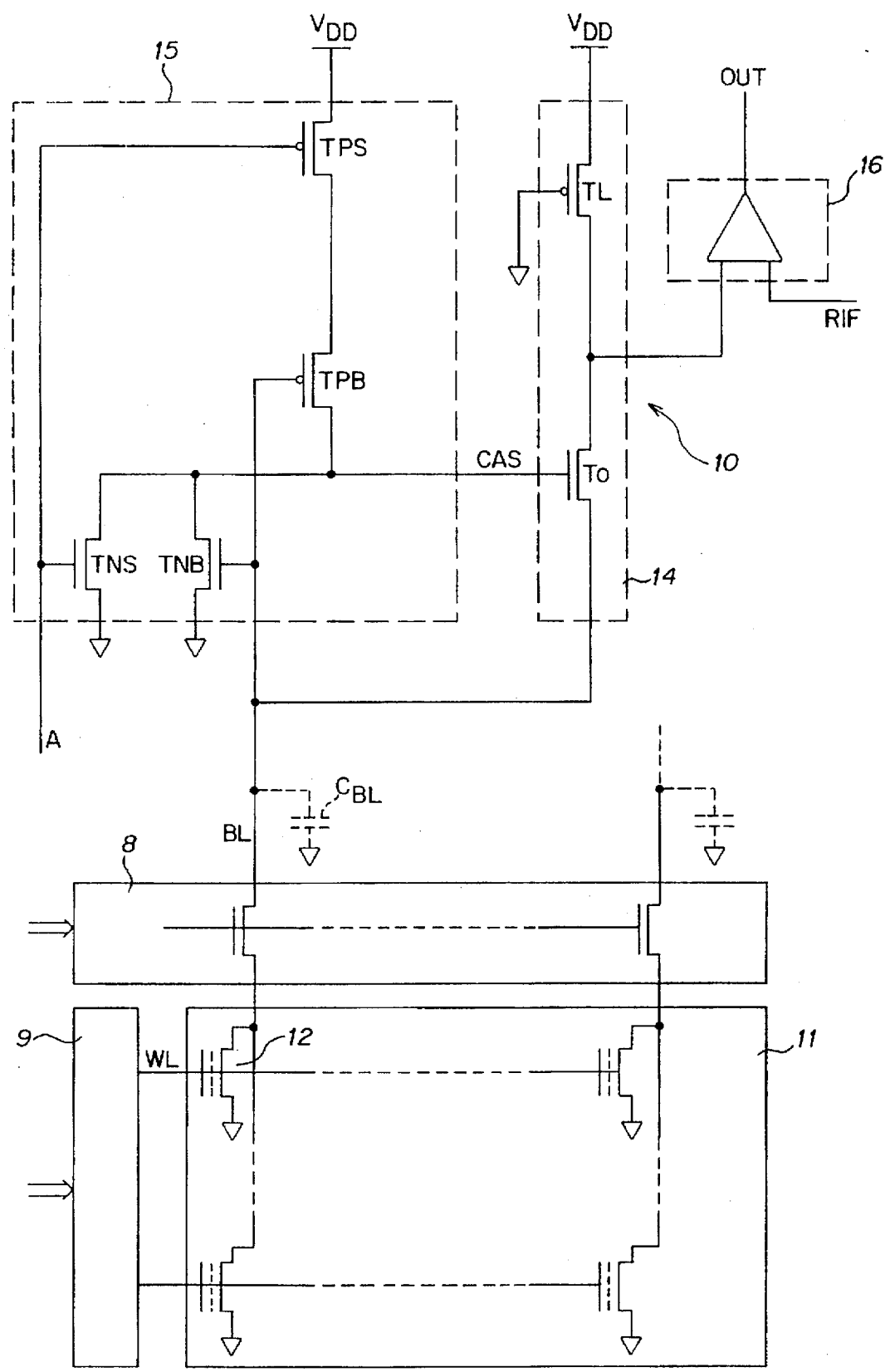
FIG. 1, which has already been described, is a circuit diagram showing a known reading circuit.
Figure 2:
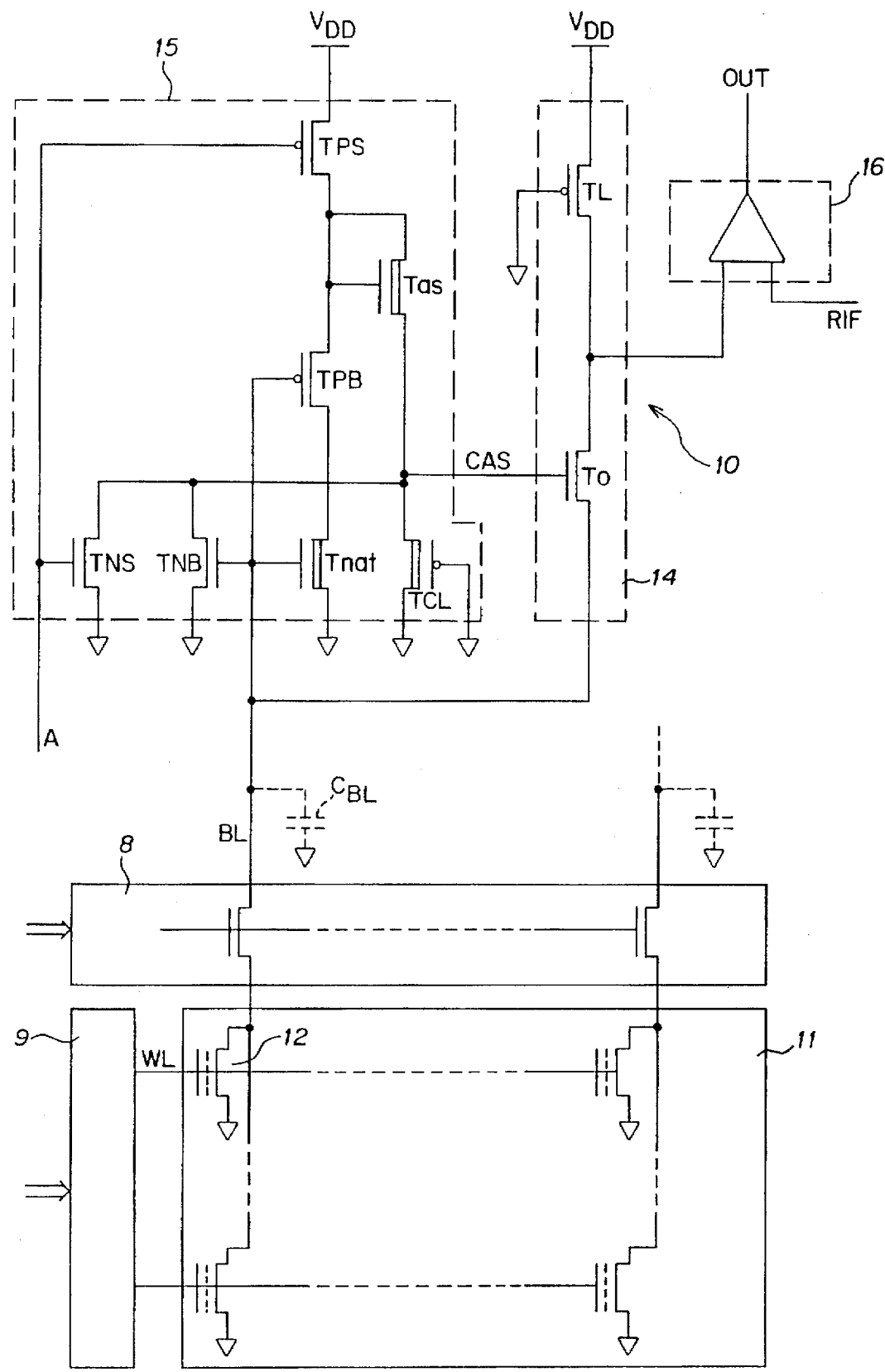
FIG. 2 is a circuit diagram showing a reading circuit according to the invention.

The diagram of FIG. 2, in which components identical or corresponding to those of FIG. 1 are indicated by the same reference symbols, will now be considered. The circuit according to the invention differs from the known circuit in particular in that it comprises means for reducing the gain in the feedback loop formed by the inverter and the switching transistor To. More particularly, these means are constituted by two additional N-channel transistors with low threshold voltages, indicated Tnat and Tas, the first connected in parallel with the transistor TNB of the inverter, that is, with its source, drain, and gate terminals connected to the source, drain, and gate terminals of the transistor TNB, respectively, and the second connected like a diode, that is, with its gate terminal joined to its drain terminal, between the source and drain terminals of the transistor TPB of the inverter. The two-transistors may be of the so-called natural type, that is produced, by the usual technology for manufacturing integrated circuits with non-volatile memories, without the region in which the channel is formed being enriched as is done to increase the threshold voltages of the normal N-channel transistors of the integrated circuit.

By virtue of the lower threshold, the transistor Tnat starts to conduct before the transistor TNB and this achieves a less abrupt transient of the current output by the driving stage 15 and hence a more gradual transition of the transistor To to the conductive states.

The transistor Tas has a similar effect, constituting a by-pass for the current between the supply pole $V_{DD}$ and the output terminal of the driving stage, which would otherwise pass solely through the P-channel transistor TPB of the inverter, so that the gain of the inverter is reduced.

It is intended that the transistor Tnat and the transistor Tas may be used not only together as described but also individually, according to specific requirements, since each of them helps to reduce the gain of the feedback loop independently of the other.

A further improvement in the performance of the driving stage 15 and hence of the entire reading circuit is achieved by the addition of a P-channel transistor connected like a diode between the drain and source terminals of the N-channel transistor TNB of the inverter. This additional transistor, indicated TCL, has a higher negative conduction threshold than normal P-channel transistors like the transistor TPB of the inverter and can also easily be formed as a natural transistor in a normal process for the manufacture of integrated circuits with non-volatile memories.

The transistor TCL starts to conduct as soon as the output voltage of the driving stage exceeds a voltage (about 1.7V) determined by its conduction threshold. This takes place when the transistor To has already started to conduct so that, in short, by creating an additional path for the current towards ground, the transistor TCL acts so as to limit the dynamics of the inverter, that is, it contributes to reaching the working level without oscillatory phenomena.

Figure 3:
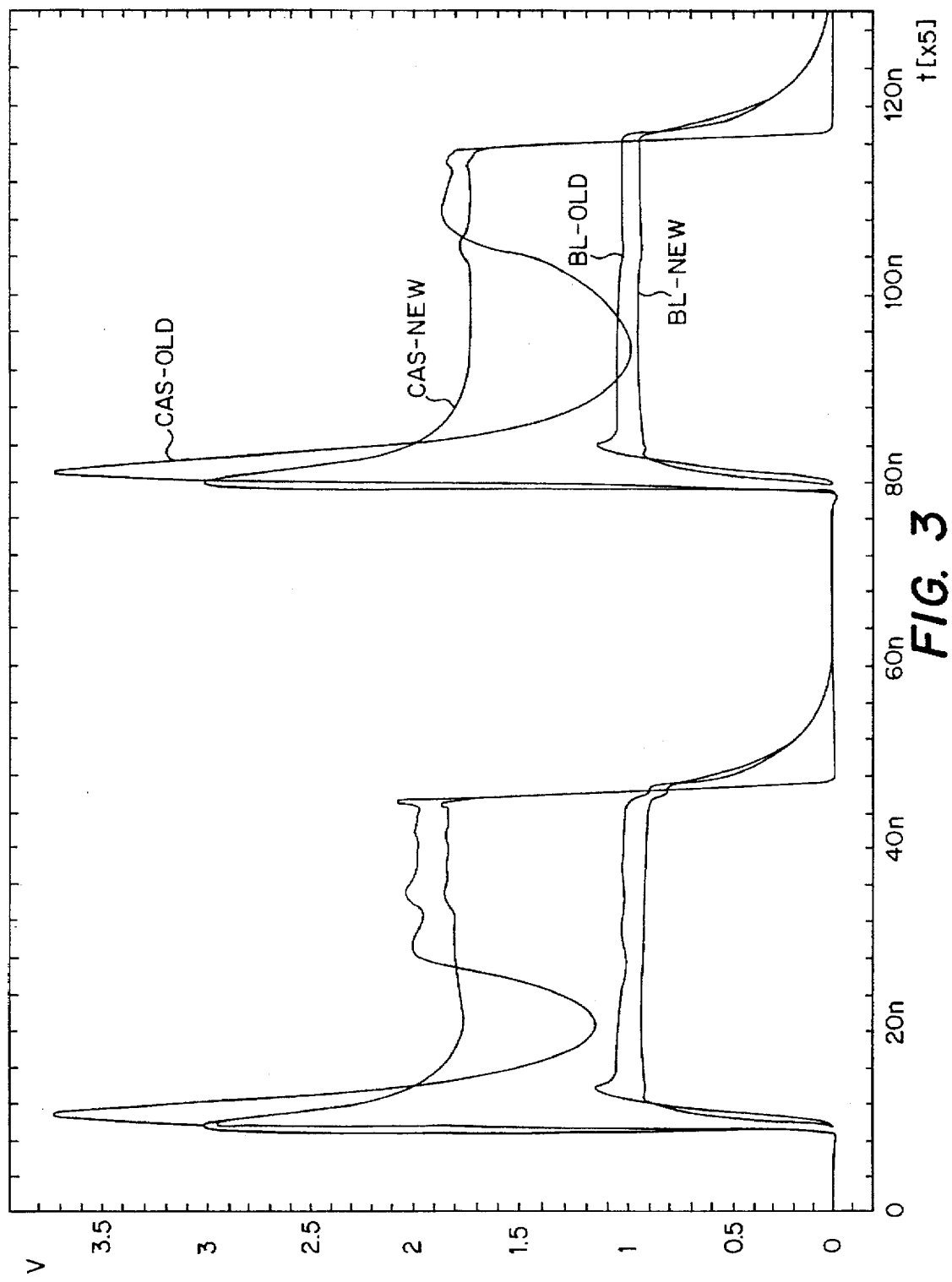
FIG. 3 is a graph showing the advantages of the circuit of the invention in comparison with the known circuit.

The improvement achieved by the circuit according to the invention can be appreciated better from an examination of the graph of FIG. 3 which compares the behavior of the voltages on the bit line BL and at the output CAS of the driving stage for the known circuit of FIG. 1 and for the circuit according to the invention of FIG. 2. As can be seen, by comparing the curves of the circuit according to the invention, indicated BL-NEW and CAS-NEW with the curves of the circuit of the prior art, indicated BL-OLD and CAS-OLD, according to the invention, the voltage on the bit line has no abrupt transients and the output voltage of the driving stage never falls to levels which could lead to the cutting-off of the transistor To.

Although only one embodiment of the invention has been described and illustrated, it is clear to one skilled in the art that many variations and modifications are possible within the scope of the same inventive concept. For example, instead of a predetermined reference voltage as in the embodiment described, the detector stage could use a reference voltage derived from the activation of reference cells which do not form part of the memory cells but are structurally equivalent thereto; in this case, the charging of the capacitance of the line which joins the reference cells together as a bit line joins the memory cells together is advantageously carried out by a switching element and with a driver stage which are identical to those described. Moreover, the inverter of the driving stage could be formed with transistors of the same type instead of with complementary transistors.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A circuit for reading a non-volatile memory formed by a matrix of cells having a plurality of bit lines and word lines, comprising: for each bit line,
   a controllable switching element for connecting the bit line to a voltage source in response to a control signal applied to a control terminal thereof;
   a detector stage sensitive to a flow of current through the bit line; and
   a driving stage comprising two field-effect transistors connected as an inverter, with an input of the inverter connected to the bit line and with an output of the inverter connected to the control terminal of the controllable switching element;
   wherein the driving stage comprises means for reducing a gain of a feedback loop formed by the inverter and by the controllable switching element, and wherein the means for reducing the gain comprises an additional field-effect transistor connected in parallel with one of the two field-effect transistors of the inverter and having a conduction threshold lower than that of the one of the two field-effect transistors.

2. A reading circuit according to claim 1, in which the two field-effect transistors are of complementary type, the gate terminals of the complementary transistors joined together at the input of the inverter and with the drain terminals joined together at the output of the inverter and wherein the additional field-effect transistor and the one of the two field-effect transistors are N-channel transistors, the other inverter field-effect transistor being a P-channel transistor.

3. A reading circuit according to claim 1, in which the means for reducing the gain comprise an N-channel by-pass transistor connected like a diode between the source and drain terminals of the P-channel transistor of the inverter.

4. A reading circuit according to claim 1, in which the driving stage comprises an additional P-channel transistor with a negative threshold higher than the threshold of the P-channel transistor of the inverter, connected like a diode between the drain and source terminals of the N-channel transistor of the inverter.

5. A reading circuit according to claim 2, in which the means for reducing the gain further comprises an additional N-channel by-pass transistor connected as a diode between the source and drain terminals of the P-channel transistor of the inverter.

6. A reading circuit according to claim 1, in which the means for reducing the gain further comprises an additional P-channel transistor having a negative threshold higher than the threshold of the P-channel transistor of the inverter, connected as a diode between the drain and source terminals of the N-channel transistor of the inverter.

7. A reading circuit according to claim 6, in which the means for reducing the gain further comprises an additional N-channel by-pass transistor connected as a diode between the source and drain terminals of the P-channel transistor of the inverter.

8. A reading circuit according to claim 1, wherein the additional field-effect transistor generates a transient signal at the output of the inverter which causes the controllable switching element to gradually transition into a conduction state.

9. A reading circuit according to claim 5, wherein the additional N-channel transistor conducts at least a portion of the current from the P-channel transistor of the inverter.

10. A reading circuit according to claim 6, wherein the additional P-channel transistor starts conducting when the controllable switching element has already started conducting.

11. A circuit for reading a non-volatile memory formed by a matrix of cells having a plurality of bit lines and word lines, comprising: for each bit line,
    a controllable switching element for connecting the bit line to a voltage source in response to a control signal applied to a control terminal thereof;
    a detector stage sensitive to a flow of current through the bit line; and
    a driving stage comprising two field-effect transistors connected as an inverter, with an input of the inverter connected to the bit line and with an output of the inverter connected to the control terminal of the controllable switching element, and an additional field-effect transistor connected in parallel with one of the two field-effect transistors of the inverter, the additional field-effect transistor having a conduction threshold lower than that of the one of the two field-effect transistors.

12. A reading circuit according to claim 11, in which the two field-effect transistors are of complementary type, the gate terminals of the complementary transistors joined together at the input of the inverter and with the drain terminals joined together at the output of the inverter and wherein the additional field-effect transistor and the one of the two field-effect transistors are N-channel transistors, the other inverter field-effect transistor being a P-channel transistor.

13. A reading circuit according to claim 12, in which the driving stage further comprises an additional N-channel by-pass transistor connected as a diode between the source and drain terminals of the P-channel transistor of the inverter.

14. A reading circuit according to claim 12, in which the driving stage further comprises an additional P-channel transistor having a negative threshold higher than the threshold of the P-channel transistor of the inverter, connected as a diode between the drain and source terminals of the N-channel transistor of the inverter.

* * * * *